(12) United States Patent
Veto

(10) Patent No.: US 10,074,791 B2
(45) Date of Patent: Sep. 11, 2018

(54) SYSTEM FOR RECAPTURING ENERGY LOST TO PLASMA OR IONIZATION HEATING

(71) Applicant: The Boeing Company, Chicago, IL (US)

(72) Inventor: Christopher C. Veto, Huntington Beach, CA (US)

(73) Assignee: The Boeing Company, Chicago, IL (US)

(*) Notice: Subject to any disclaimer, the term of this patent is extended or adjusted under 35 U.S.C. 154(b) by 69 days.

(21) Appl. No.: 15/040,530

(22) Filed: Feb. 10, 2016

(65) Prior Publication Data
US 2017/0229629 A1    Aug. 10, 2017

(51) Int. Cl.
*H01L 35/32* (2006.01)
*H01L 35/30* (2006.01)

(52) U.S. Cl.
CPC ............ *H01L 35/325* (2013.01); *H01L 35/30* (2013.01); *H01L 35/32* (2013.01)

(58) Field of Classification Search
CPC .............................. H01L 35/32; H01L 35/325
USPC ................... 136/205, 208, 218, 230
See application file for complete search history.

(56) References Cited

U.S. PATENT DOCUMENTS

| | | | |
|---|---|---|---|
| 3,289,749 A * | 12/1966 | Crump | A61B 18/02 165/48.1 |
| 3,329,532 A * | 7/1967 | Austin | F03H 1/00 136/202 |
| 4,687,879 A * | 8/1987 | Hendricks | H01L 35/32 136/212 |
| 6,700,052 B2 * | 3/2004 | Bell | H01L 35/32 136/201 |
| 9,112,109 B2 | 8/2015 | Kwok et al. | |
| 2009/0159110 A1 * | 6/2009 | Kwok | F02C 6/18 136/205 |
| 2010/0257871 A1 * | 10/2010 | Venkatasubramanian | H01L 23/38 62/3.7 |
| 2012/0125015 A1 | 5/2012 | Renze et al. | |
| 2013/0205798 A1 | 8/2013 | Kwok et al. | |

OTHER PUBLICATIONS

Choueiri, Edgar; "Physics of Plasma Propulsion," Princeton University, The Graduate School, Department of Mechanical and Aerospace Engineering, Course Notes, MAE 528/AST 566, 2015, pp. 1 and 28-30.

* cited by examiner

*Primary Examiner* — Lindsey Bernier
(74) *Attorney, Agent, or Firm* — Charles L. Moore; Moore & Van Allen PLLC

(57) ABSTRACT

A system for recapturing energy may include a thermoelectric generator (TEG) assembly for thermally attaching to a surface heated by plasma or ionization heating. The TEG assembly may include a first level thermoelectric generator module (TEM). The first level TEM may include a hot side that is thermally attached to the surface, a cold side and a plurality of TEG devices disposed between the hot side and the cold side. A second level TEM may be stacked on the first level TEM. A hot side of the second level TEM may be thermally attached to the cold side of the first level TEM. The plurality of TEG devices generate an electric current based on a temperature differential across the TEG devices. The TEG assembly may also include an electrical wiring system that electrically connects the TEMs and supplies the electric current generated to an electrical power apparatus.

20 Claims, 6 Drawing Sheets

SYSTEM FOR RECAPTURING ENERGY LOST TO PLASMA OR IONIZATION HEATING

CROSS-REFERENCE TO RELATED APPLICATIONS

The present application is related to U.S. patent application Ser. No. 14/952,166, filed Nov. 25, 2015, entitled "Thermal Electric Assembly Attached on an Outer Surface of a Hot Section of a Gas Turbine Engine to Generate Electrical Power" which is assigned to the same assignee as the present application and is incorporated herein by reference.

FIELD

The present disclosure relates to recapturing energy that would be lost, and more particularly to a system for recapturing energy lost to plasma heating or ionization heating.

BACKGROUND

A substantial amount of energy is lost because of heat dissipation associated with thrusters or engines for propulsion of spacecraft, aircraft or other vehicles. Such vehicles, particularly spacecraft, for example satellites, also use batteries to provide electrical power to the vehicle or spacecraft. These batteries are typically charged or re-charged by solar energy. Accordingly, the battery capacity or requirements may have to be considerably high to continuously power the spacecraft during long periods when sunlight or solar energy is not available. For example, the spacecraft may go into an eclipse, a solar panel may become permanently malfunctioning, or the efficiency of a solar cell will degrade over the lifetime of the orbit or during proton bombardment while in transfer orbit through the inner Van Allen belt. This causes an in increase in weight onboard the vehicle or spacecraft for additional battery capacity and the additional batteries occupy additional volume onboard the vehicle or spacecraft. Additionally, an increased number of solar arrays may also be required which necessitate additional volume onboard the spacecraft and a further increase in weight onboard the vehicle. Accordingly, there is a need to recapture energy lost because of heat dissipation to reduce battery capacity and solar cell requirements.

SUMMARY

In accordance with an embodiment, a system for recapturing energy may include a thermoelectric generator assembly configured for thermally attaching to a surface heated by one of plasma heating or ionization heating. The thermoelectric generator assembly may include a first level thermoelectric generator module. The first level thermoelectric generator module may include a hot side that is thermally attached to the surface, a cold side opposite to the hot side and a plurality of thermoelectric generator devices disposed between the hot side and the cold side. The plurality of thermoelectric generator devices generates an electric current based on a temperature differential across each of the plurality of thermoelectric generator devices. The thermoelectric generator assembly may also include a second level thermoelectric generator module stacked on the first level thermoelectric generator module. The second level thermoelectric generator module may include a hot side thermally attached to the cold side of the first level thermoelectric generator module, a cold side opposite to the hot side and a plurality of thermoelectric generator devices disposed between the hot side and the cold side. The plurality of thermoelectric generator devices generates an electric current based on a temperature differential across each of the plurality of thermoelectric generator devices. The thermoelectric generator assembly may also include an electrical wiring system that electrically connects the second level thermoelectric generator module to the first level thermoelectric generator module and supplies the electric current generated by the first level thermoelectric generator module and the second level thermoelectric generator module to an electrical power apparatus.

In accordance with another embodiment, a system for recapturing energy may include a thruster including a nozzle. The nozzle may be heated by plasma heating or ionization heating of propellant gases being discharged through the nozzle. The system may include a plurality of thermoelectric generator assemblies. Each thermoelectric generator assembly may include a first level thermoelectric generator module. The first level thermoelectric generator module may include a hot side thermally attached to an exterior surface of the nozzle, a cold side opposite to the hot side and a plurality of thermoelectric generator devices disposed between the hot side and the cold side. The plurality of thermoelectric generator devices generates an electric current based on a temperature differential across each of the plurality of thermoelectric generator devices. The thermoelectric generator assembly may also include a second level thermoelectric generator module stacked on the first level thermoelectric generator module. The second level thermoelectric generator module may include a hot side thermally attached to the cold side of the first level thermoelectric generator module, a cold side opposite to the hot side and a plurality of thermoelectric generator devices disposed between the hot side and the cold side. The plurality of thermoelectric generator devices generates an electric current based on a temperature differential across each of the plurality of thermoelectric generator devices. The thermoelectric generator assembly may also include an electrical wiring system that electrically connects the plurality of thermoelectric generator assemblies to a power management system.

In accordance with a further embodiment, a method for recapturing energy may include thermally attaching a plurality of thermoelectric generator modules to an exterior surface a nozzle of a thruster. The nozzle may be heated by plasma heating or ionization heating of propellant gases being discharged through the nozzle. Each thermoelectric generator module may include a first level thermoelectric generator module. The first level thermoelectric generator module may include a hot side thermally attached to an exterior surface of the nozzle, a cold side opposite to the hot side and a plurality of thermoelectric generator devices disposed between the hot side and the cold side. The plurality of thermoelectric generator devices generates an electric current based on a temperature differential across each of the plurality of thermoelectric generator devices. The thermoelectric generator assembly may also include a second level thermoelectric generator module stacked on the first level thermoelectric generator module. The second level thermoelectric generator module may include a hot side thermally attached to the cold side of the first level thermoelectric generator module, a cold side opposite to the hot side and a plurality of thermoelectric generator devices disposed between the hot side and the cold side. The plurality of thermoelectric generator devices generates an electric current based on a temperature differential across each of the plurality of thermoelectric generator devices. The thermoelectric generator assembly may additionally include an electrical wiring system that electrically connects the plurality of thermoelectric generator assemblies to a power management system. The method may also include capturing waste heat from the nozzle by the plurality of thermoelectric generator assemblies and converting the captured waste heat by the plurality of thermoelectric generator assemblies into electrical power.

In accordance with another embodiment or any of the previous embodiments, a third level thermoelectric generator module may be stacked on the second level thermoelectric generator module. The third level thermoelectric generator module may include a hot side thermally attached to the cold side of the second level thermoelectric generator module, a cold side opposite the hot side and a plurality of thermoelectric generator devices disposed between the hot side and the cold side. The plurality of thermoelectric generator devices generates an electric current based on the temperature differential across the plurality of thermoelectric generator devices. The third level thermoelectric generator module is electrically connected to the second level thermoelectric generator module by the electrical wiring system and the first level thermoelectric generator module, the second level thermoelectric generator module and the third level thermoelectric generator module are arranged in a triple stack configuration using a pyramid geometry for increased temperature differential across each of the thermoelectric generator modules. An area of the hot side and the cold side of each of the thermoelectric generator modules decreases from the first level thermoelectric generator module to the third level thermoelectric generator module.

In accordance with another embodiment or any of the previous embodiments, each of the first level, second level and third level thermoelectric generator modules may include a different type of thermoelectric generator device based on a efficiency in converting thermal energy to electrical energy accordingly to a temperature on the hot side of each respective thermoelectric module and a temperature differential between the hot side and the cold side of each respective thermoelectric generator module.

In accordance with another embodiment or any of the previous embodiments, a layer of material may be applied to cover the thermoelectric generator modules and at least a portion of the electrical wiring system. The layer of material may be configured to protect the system from radiation and moisture and to prevent electrostatic discharge from the system.

In accordance with another embodiment or any of the previous embodiments, the thermoelectric generator modules may each include a curved configuration that corresponds to a contour of the surface to which the thermoelectric generator assembly is thermally attached.

In accordance with another embodiment or any of the previous embodiments, the thermoelectric generator modules may include flexible materials that allow the thermoelectric generator modules to flex with any movement of the surface.

BRIEF DESCRIPTION OF THE DRAWINGS

The following detailed description of embodiments refers to the accompanying drawings, which illustrate specific embodiments of the disclosure. Other embodiments having different structures and operations do not depart from the scope of the present disclosure.

DETAILED DESCRIPTION

Figure 1:
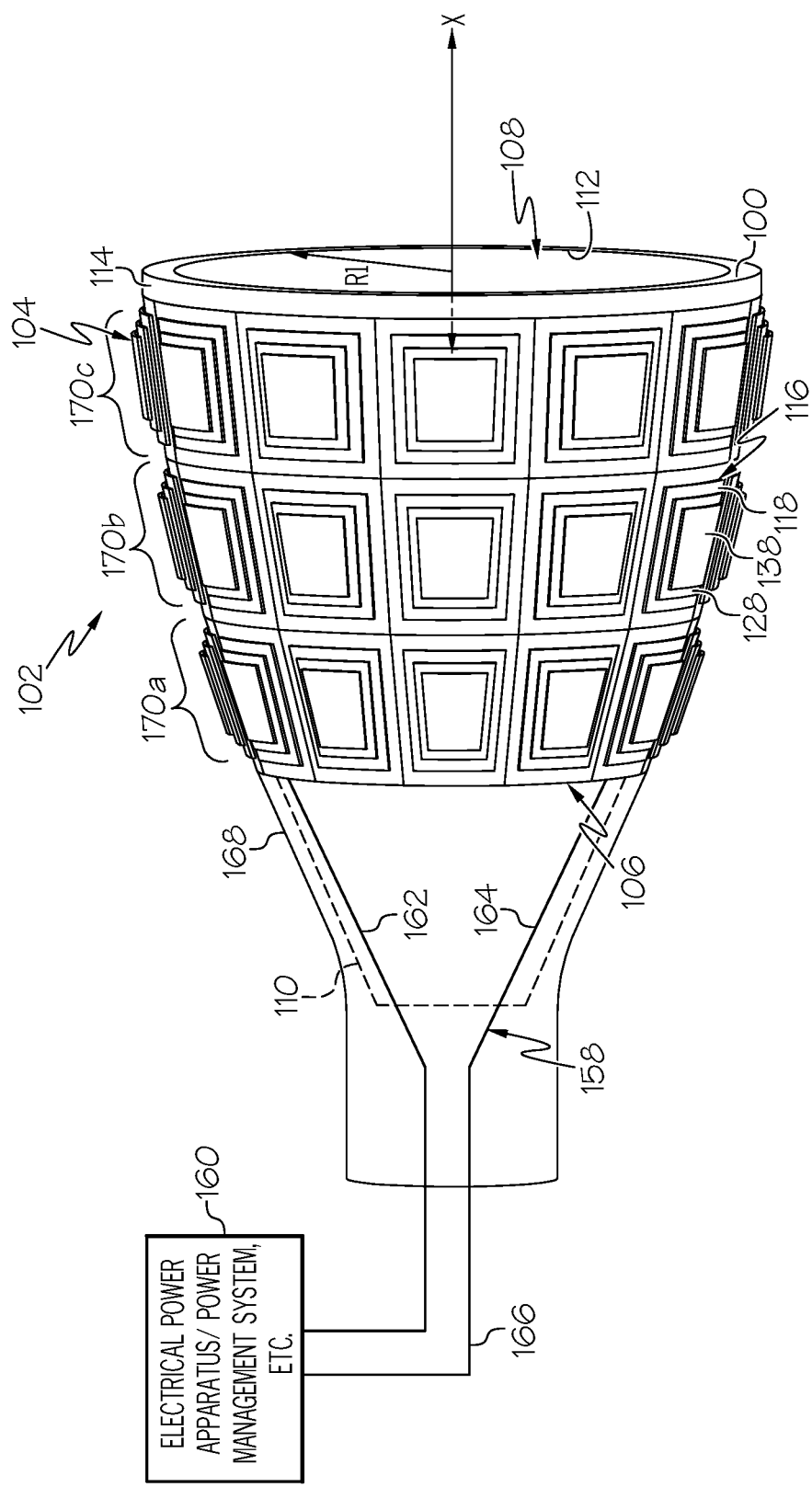
FIG. 1 is side view of an example of a nozzle of a thruster including a system for recapturing energy in accordance with an embodiment of the present disclosure.

The following detailed description of embodiments refers to the accompanying drawings, which illustrate specific embodiments of the disclosure. Other embodiments having different structures and operations do not depart from the scope of the present disclosure. Like reference numerals may refer to the same element or component in the different drawings. Although the disclosure is intended for space-based thrusters, the disclosure does not limit the use to spacecraft.

Certain terminology is used herein for convenience only and is not to be taken as a limitation on the embodiments described. For example, words such as "proximal", "distal", "top", "bottom", "upper," "lower," "left," "right," "horizontal," "vertical," "upward," and "downward", etc., merely describe the configuration shown in the figures or relative positions used with reference to the orientation of the figures being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

FIG. 1 is side view of an example of a nozzle 100 of a thruster 102 including a system 104 for recapturing energy in accordance with an embodiment of the present disclosure. Examples of the thruster 102 may including but is not limited to electromagnetic thrusters, electrostatic thrusters, electrothermal thrusters, air-breathing engines or similar apparatus for propulsion of a vehicle, such as a spacecraft, aircraft, rocket or other type vehicle. Examples of electromagnetic thrusters may include, but is not limited to, magnetoplasmadynamic (MPD) thrusters (MPDT), pulsed plasma thrusters (PPT), and Hall-effect thrusters (HET). Examples of electrostatic thrusters may include, but is not limited to, ion thrusters, colloaid thrusters, and field-emission electric propulsion (FEEP) thrusters. Examples of electrothermal thrusters may include, but is not limited to, microwave thrusters, magnetic nozzle thrusters, resistojets and arcjets. Examples of air-breathing engines may include, but is not limited to, turbojets, ramjets and scramjets. The system 104 for recapturing energy, as described herein, may be configured for capturing heat from plasma heating or ionization heating by the thruster 102. However, the system 104 for recapturing energy is not intended to be limited by the exemplary application described herein and those skilled in the art will recognize that the system 104 may be configured for other applications and uses.

The nozzle 100 may be substantially cone shaped including an intake 106 or input opening at a smaller radius end of the cone-shaped nozzle 100 and an exhaust 108 at a wider radius end of the nozzle 100. Accelerating propulsion gases enter the nozzle 100 from a combustion chamber 110 via the intake 106 and escape via the exhaust 108 for propulsion of the vehicle to which the thruster 102 is attached, for example, spacecraft 600 in FIG. 6. The exhaust 108 of the nozzle 100 may have a radius R1 about an axis X of the nozzle 100. The axis X may define a centerline along a longitudinal length of the nozzle 100 from the intake 106 to the exhaust 108. An internal radius of the nozzle 100 in a plane through the axis X may vary from the intake 106 to the exhaust 108 of the nozzle 100. The internal radius of the nozzle 100 is smallest at the intake 106 and gradually increases toward the exhaust 108 where the radius of the nozzle 100 may be largest. In an embodiment, an interior surface 112 and an exterior surface 114 of the nozzle 100 may be linear in a longitudinal direction along the axis X between the intake 106 and the exhaust 108. In another embodiment, the interior surface 112 and the exterior surface 114 of the nozzle 100 may be curved in the longitudinal direction along the axis X or in plane corresponding to the axis X between the intake 106 and the exhaust 108. Accordingly, the interior surface 112 and exterior surface 114 of the nozzle 100 may have radii that vary in at least two directions, circumferentially about the axis X and longitudinally along the axis X between the intake 106 and the exhaust 108 of the nozzle 100. For example, radius R1 extends circumferentially about the axis X and radius R2 (FIG. 3) that defines an arc between the intake 106 and the exhaust 108. The radius R1 may be referred to as a radial radius and the radius R2 may be referred to as an axial radius of the nozzle 100.

The system 104 for recapturing energy may include at least one thermoelectric generator assembly 116 configured for thermally attaching to a surface heated by one of plasma heating or ionization heating. In the example illustrated in FIG. 1, the system 104 for recapturing energy includes a plurality of thermoelectric generator assemblies 116 that are thermally attached to the exterior surface 114 of the nozzle 100. Each of the plurality of thermoelectric generator assemblies 116 may be bonded to the exterior surface 114 of the nozzle 100 by a thermally conductive bonding agent 126 (FIG. 2), adhesive or other arrangement for thermally attaching the thermoelectric generator assemblies 116 to the nozzle 100. As previously discussed, the nozzle 100 may be heated by plasma heating or ionization heating of propellant gases accelerating through the nozzle 100 and being discharge through the exhaust 108. The energy lost due to plasma heating and ionization may be modeled by the equation 1:

$$VJ = \int_V \frac{j^2}{\sigma} dV + \int_V ujB\, dV + V_E J \qquad \text{Equation 1}$$

Equation 1 is from course notes entitled *Physics of Plasma Propulsion* by Professor Edgar Choueiri, Department of Mechanical and Aerospace Engineering, Princeton University, Princeton, N.J. 2015. The first term of equation 1 is the sum of energy lost to heating; a percentage of this energy will be recaptured through the system 104.

Figure 2:
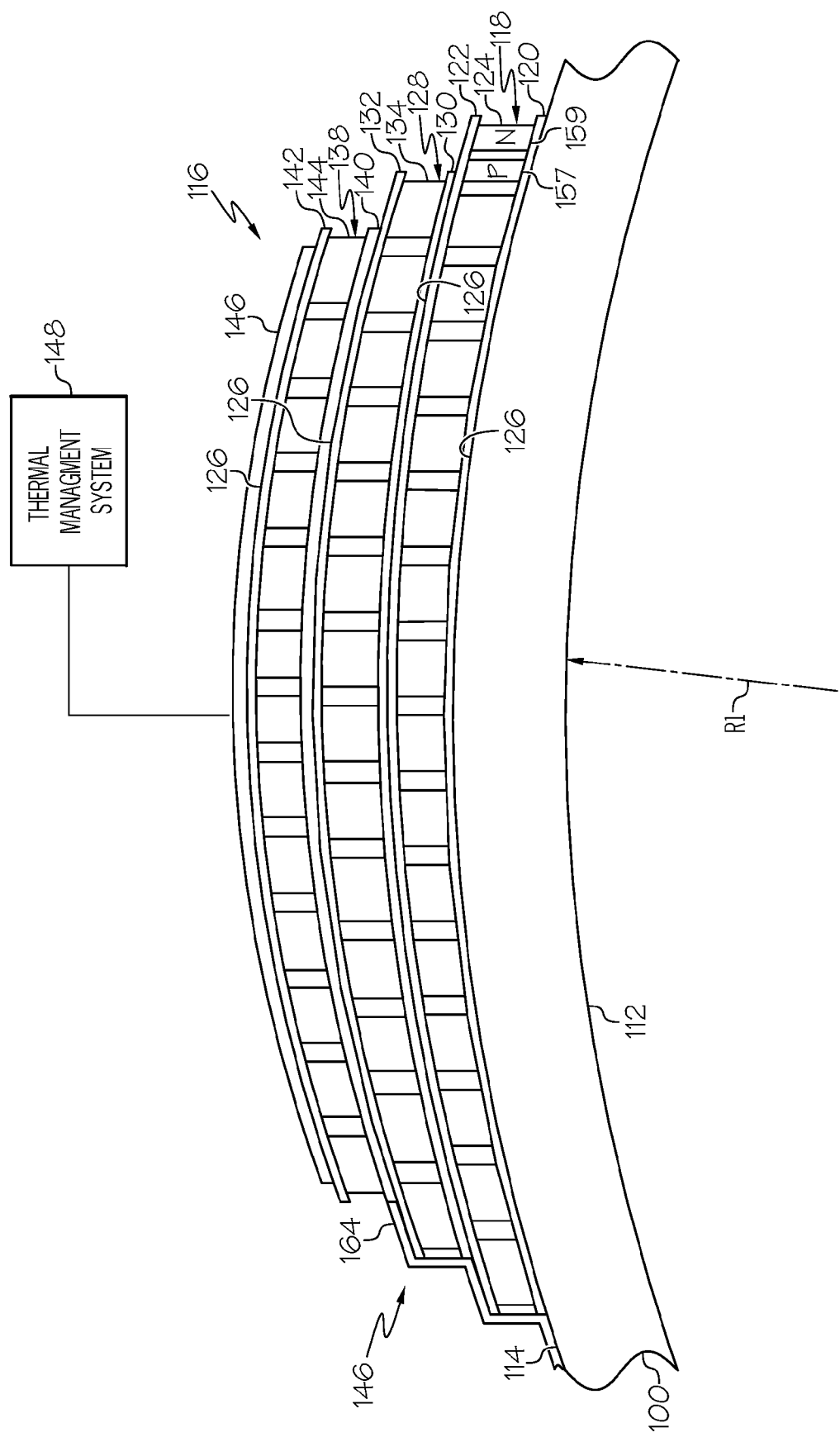
FIG. 2 is a partial end view of the nozzle of the thruster showing a detailed view of a thermoelectric generator assembly in accordance with an embodiment of the present disclosure.

Referring also to FIG. 2, FIG. 2 is a partial end view of the nozzle 100 of the thruster 102 showing a detailed view of a thermoelectric generator assembly 116 in accordance with an embodiment of the present disclosure. Each thermoelectric generator assembly 116 may include a first level thermoelectric generator module (TEM) 118. The first level TEM 118 may include a hot side 120 that is thermally attached to the exterior surface 114 of the nozzle 100, a cold side 122 opposite to the hot side 120 and a plurality of thermoelectric generators (TEG) or TEG devices 124 disposed between the hot side 120 and the cold side 122. The hot side 120 of the first level TEM 118 may be thermally attached to the exterior surface 114 of the nozzle 100 by a thermally conductive bonding agent 126, adhesive or other arrangement that thermally transfers heat from the exterior surface 114 of the nozzle 100 to the hot side 120 of the first level TEM 128 with minimal if any heat dissipation or loss. The plurality of TEG devices 124 generates an electric current based on a temperature differential across each of the plurality of TEG devices 124 or a temperature gradient between the hot side 120 and the cold side 122.

Figure 3:
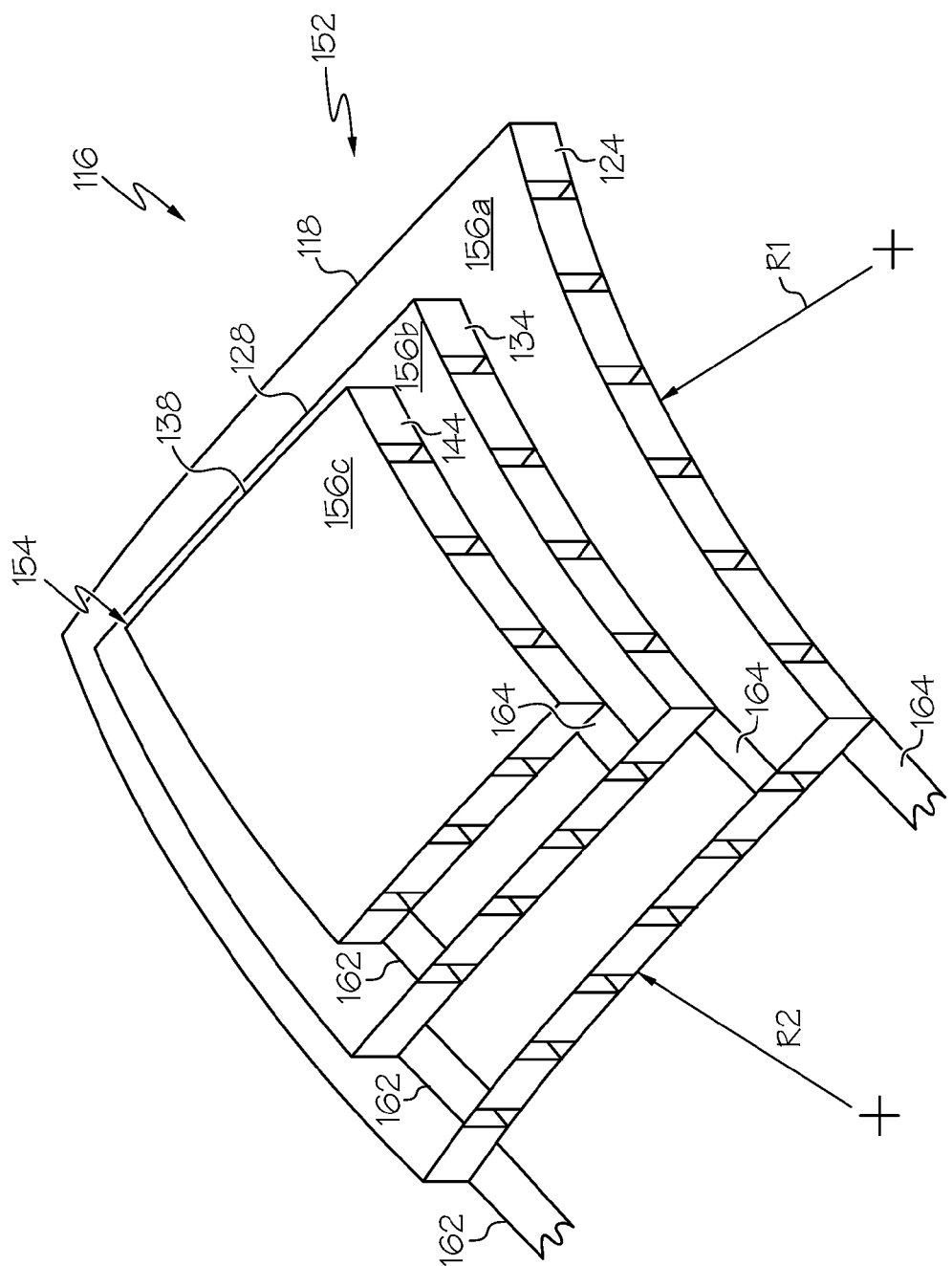
FIG. 3 is a perspective view of the thermoelectric generator assembly in FIG. 2.

Each thermoelectric generator assembly 116 may also include a second level TEM 128 stacked on the first level TEM 118. The second level TEM 128 may include a hot side 130 that is thermally attached to the cold side 122 of the first level TEM 118, a cold side 132 opposite to the hot side 130 and a plurality of TEG devices 134 disposed between the hot side 130 and the cold side 132. The hot side 130 of the second level TEM 128 may be thermally attached to the cold side 122 of the first level TEM 118 by a thermally conductive bonding agent 126, adhesive or other arrangement that thermally transfers heat from the cold side 122 to the hot side 130 of the second level TEM 128 with minimal if any heat dissipation loss. The plurality of TEG devices 134 also generates an electric current based on a temperature differential across each of the plurality of TEG devices 134. The second level TEM 128 may be electrically connected to the first level TEM 118 by electrical conductors 162 and 164 as best shown in FIG. 3. The first level TEM 118 and the second level TEM 128 may be electrically connected in series.

In accordance with an embodiment, each thermoelectric generator assembly 116 may also include at least a third level TEM 138 stacked on the second level TEM 128. The third level TEM 138 may include a hot side 140 that is thermally attached to the cold side 132 of the second level TEM 128, a cold side 142 opposite the hot side 140 and a plurality of TEG devices 144 disposed between the hot side 140 and the cold side 142. The hot side 140 of the third level TEM 138 may be thermally attached to the cold side 132 of the second level TEM 128 by a thermally conductive bonding agent 126, adhesive or other arrangement that thermally transfers heat from the cold side 132 to the hot side 1140 of the third level TEM 144 with minimal if any heat dissipation or loss. The plurality of TEG devices 144 generates an electric current based on a temperature differential across the plurality of TEG devices 144 or temperature gradient between the hot side 140 and cold side 142 of the third level TEM 138. The third level TEM 138 may be electrically connected to the second level TEM 128 by electrical conductors 162 and 164 (FIG. 3). The first level TEM 118, second level TEM 128 and third level TEM 138 may be electrically connected in series.

A thermally conductive device 146 may be thermally attached to the cold side 142 of the third level TEM 138. The thermally conductive device 146 may be configured for connection to a thermal management system 148. The thermally conductive device 146 and thermal management system 148 may create a larger temperature differential between the hot side 120 of the first level TEM 118 and the cold side 142 of the third level TEM 138 to increase efficiency of converting the heat energy to electrical energy by the thermoelectric generator assembly 116. The thermally conductive device 146 may be thermally attached to the cold side 142 of the third level TEM 138 by a thermally conductive bonding agent 126, adhesive or other arrangement that thermally transfers heat from the cold side 142 of the third level TEM 138 to the thermally conductive device 146 with minimal if any heat dissipation. The thermally conductive device 146 may be a heat energy conducting strap, referred to in the industry as a "thermal strap," or other arrangement to transfer heat from the thermoelectric generator assembly 116 to the thermal management system 148 for efficient conversion of heat or thermal energy to electrical energy by the thermoelectric generator assembly 116.

A layer 168 of material (FIG. 1) may cover the thermoelectric generator assemblies 116 and at least a portion of the electrical wiring system 158. The layer 168 of material is not shown as covering the thermoelectric generator assemblies 116 in FIG. 1 so that the thermoelectric generator assemblies 116 are visible. The layer 168 of material may include properties and may be configured or applied to protect the system 104 from radiation and moisture. The layer 168 of material may also include properties to prevent electrostatic discharge from the system 104 or electrostatic discharge protection properties. An examples of the layer 168 of material may include a glop top epoxy configured and/or including properties for purposes including but not limited to radiation hardening and structural mode suppression, other aerospace material, including but not limited to, thermal blankets, protective silicon oxide ($SiO_2$) coating, microlattice structure for purposes including but not limited to electromagnetic (EM) radiation protection via Faraday Effect or other similar materials.

Referring also to FIG. 3, FIG. 3 is a perspective view of the thermoelectric generator assembly 116 in FIG. 2. The first level TEM 118, second level TEM 128 and third level TEM 138 may be arranged in a triple stack configuration 152 using a pyramid geometry 154 for increased temperature differential across each of the TEMs 118, 128 and 138. An area 156a, 156b and 156c of the hot side and the cold side of each of the TEMs 118, 128 and 138 may decrease from the first level TEM 118 to the third level TEM 138. The first level TEM 118 may include a curved configuration that corresponds to a contour of the exterior surface 114 of the nozzle 100. The second level TEM 128 and the third level TEM 138, if provide, may also each include a curved configuration that corresponds to the adjacent level TEM. Accordingly, the first level TEM 118, second level TEM 128 and third level TEM 138, if provided, each include a curved configuration that corresponds to the exterior surface 114 of the nozzle 100 for efficient heat transfer from the exterior surface 114 of the nozzle 100 and through the TEMs 118, 128 and 138 for efficient conversion of the heat or thermal energy to electrical energy. The TEMs 118, 128 and 138 may be formed from flexible materials that allow the TEMs 118, 128 and 138 to flex with any movement of the exterior surface 114 of the nozzle 100. For example, the materials may be any substances that permit the TEMs 118, 128 and 138 or thermoelectric generator assembly 116 to flex without the TEM thermoelectric generator assembly 116 breaking down or coming apart or being unable to function as described herein.

Each of the TEG devices 124, 134 and 144 may include one or more p-doped semiconductors 157 and one or more n-doped semiconductors 159 or thermoelectric generator materials as described with reference to FIGS. 4 and 5. The semiconductors 157 and 159 or crystals may be shaped in each layer or level TEM 118, 128 and 138 so that each thermoelectric generator module 116 matches or corresponds to the contour of the exterior surface 114 of the nozzle 100 at whatever location a particular thermoelectric generator module 116 may be located. As previously described and as illustrated in FIG. 3, the exterior surface 114 of the nozzle 100 may have radii that vary in at least two directions, circumferentially about the axis X (FIG. 1) or radial radius R1 and longitudinally along the axis X between the intake 106 and the exhaust 108 of the nozzle 100 or axial radius R2. The semiconductors 157 and 159 of each thermoelectric generator assembly 116 may be shaped to match the radii of curvature or radial radius R1 and axial radius R2 of the exterior surface 114 of the nozzle 100 at the particular location were each thermoelectric generator assembly 116 may be placed to provide efficient conversion of heat energy to electrical energy with minimal heat loss or dissipation. The semiconductors 157 and 159 may be shaped by any process used to shape or form semiconductor materials, such as ablation, chemical vapor deposition, or other processes for adding, removing or shaping material.

An electrical wiring system 158 (FIG. 1) may electrically connect the plurality of thermoelectric generator assemblies 116 to an electrical power apparatus 160. The electrical power apparatus 160 may be a power management system, power distribution system or both. Each thermoelectric generator assembly 116 may include electrical conductors 162 and 164 (FIG. 3) that electrically connect the third level TEM 138 to the second level TEM 128 and the second level TEM 128 to the first level TEM 118. The electrical conductors 162 and 164 from each level TEM 118, 128 and 138 may connect to a power bus 166 (FIG. 1). The power bus 166 supplies the electric current generated by the TEMs 118, 128 and 138 to the electrical power apparatus 160. The thermoelectric generator assemblies 116 may be electrically connected in series.

As previously described, each thermoelectric generator assembly 116 may include a plurality of thermoelectric generators (TEG) or TEG devices 124, 134 and 144 that generate an electric current based on a temperature differential across each of the plurality of TEG devices 124, 134 and 144. A TEG or TEG device 124, 134 and 144 can generate electricity when a temperature differential is applied or exists across the device. The TEG device 124, 134 or 144 may typically be square or rectangular shaped with an upper and lower end-cap having the same dimension. Typically power generated by TEGs is transmitted via a set of electrical conductors 162 and 164 or a power bus 166 similar to that described herein with reference to FIG. 1. TEG devices 124, 134 and 144 are typically thin (e.g., on the order of a couple of millimeters thick), small (e.g., a couple of square centimeters), flat, and brittle. Accordingly, TEG devices 124, 134 and 144 can be difficult to handle individually, especially for applications on thruster nozzles as described herein and vehicles, such as spacecraft, aircraft, automobiles and the like, where the TEG devices 124, 134 and 144 can be subject to harsh environmental conditions, such as vibration, constant temperature variations and other harsh conditions. Because of their size and the fact that each TEG device 124, 134 and 144 generates only a small amount of power, many TEG devices 124, 134 and 144 are bundled together in order to generate a useful amount of power. Further, TEG devices 124, 134 and 144 generally provide greater energy conversion efficiency at high temperature. This can cause relatively large thermal expansion in materials. Because of thermal gradients and different thermal coefficients of expansion associated with different materials, thermally induced stresses may result. Efficiency of TEG devices 124, 134 and 144 generally increases with greater temperature differentials, i.e., delta temperature between two opposite sides, typically called the heat source or hot side 120 and heat sink or cold side 122 of the TEG device 124 in the first level TEM 118. Also, energy conversion efficiency is maximized for any installation that channels heat flow through the TEG devices 124, 134 and 144 only without any thermal energy leaks through the surrounding structural material or gaps. Thus, to simplify handling and achieve high performance in converting heat to electricity, multiple TEG devices 124, 134 and 144 can be encased into a module such as TEMs 118, 128 and 138 and an assembly, such as assembly 116 prior to final installation.

As previously described, the temperature of the exterior surface 114 of the nozzle 100 may vary along the nozzle 100. The TEG devices 124, 134 and 144 may include different materials that may be used in different heat zones 170a-170c (FIG. 1) along the nozzle 100 between the combustion chamber 110 and the exhaust 108 of the nozzle 100. For example, a temperature of the exterior surface 114 of the nozzle 100 may be hottest at an exhaust of the combustion chamber 110 or intake 106 of the nozzle 100 and the temperature of the exterior surface 114 may gradually decrease along the nozzle 100 toward the exhaust 108.

Additionally, each of the first level, second level and third level TEMs 118, 128 and 138 may include a different type of TEG device 124, 134 and 144. The different types of TEG devices 124, 134 and 144 of each of the first level, second level and third level TEMs 118, 128 and 138 may be configured to generate a predetermined level of electrical power based on a temperature on the hot side of each respective TEM 118, 128 and 138 and a temperature differential between the hot side and the cold side of each respective TEM 118, 128 and 138. Each of the first level, second level and third level TEMs 118, 128 and 138 may include the different types of TEG device 124, 134 and 144 based on an efficiency in converting thermal energy to electrical energy according to a temperature on the hot side of each respective level TEM 118, 128 and 138 and a temperature differential between the hot side and the cold side of each respective level TEM 118, 128 and 138.

Figure 4:
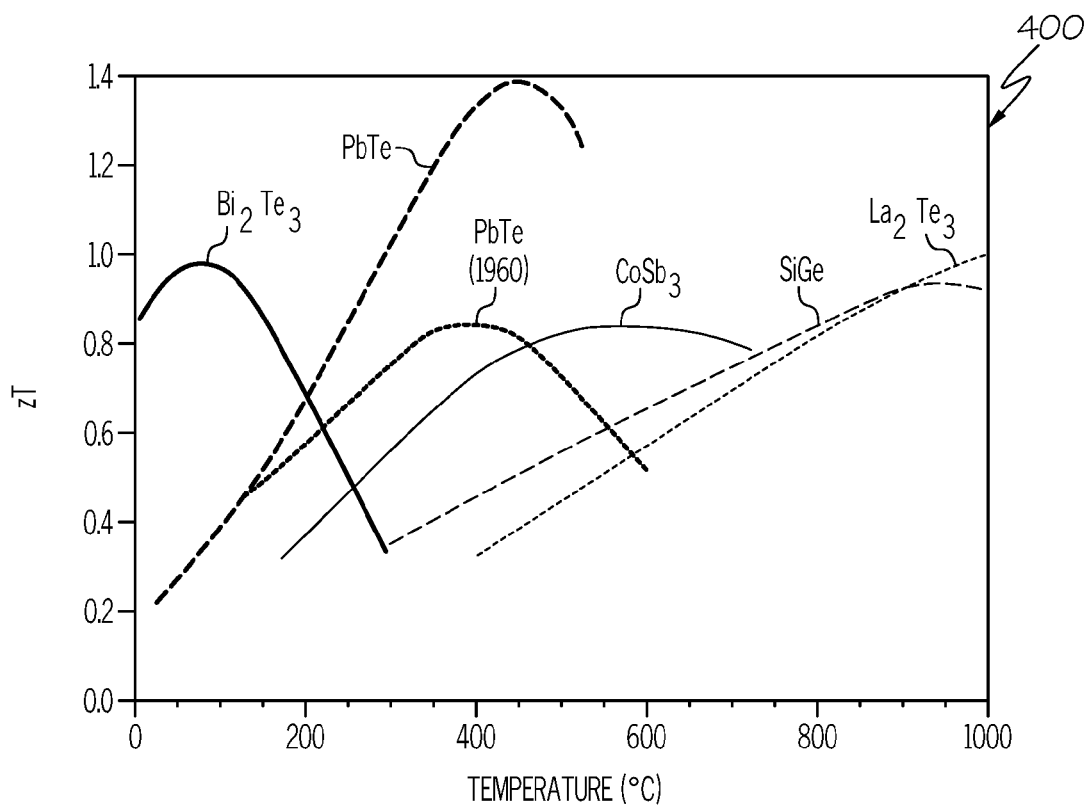
FIG. 4 is a graph illustrating an efficiency of different n-type thermoelectric generator materials at different temperatures in accordance with an embodiment of the present disclosure.
Figure 5:
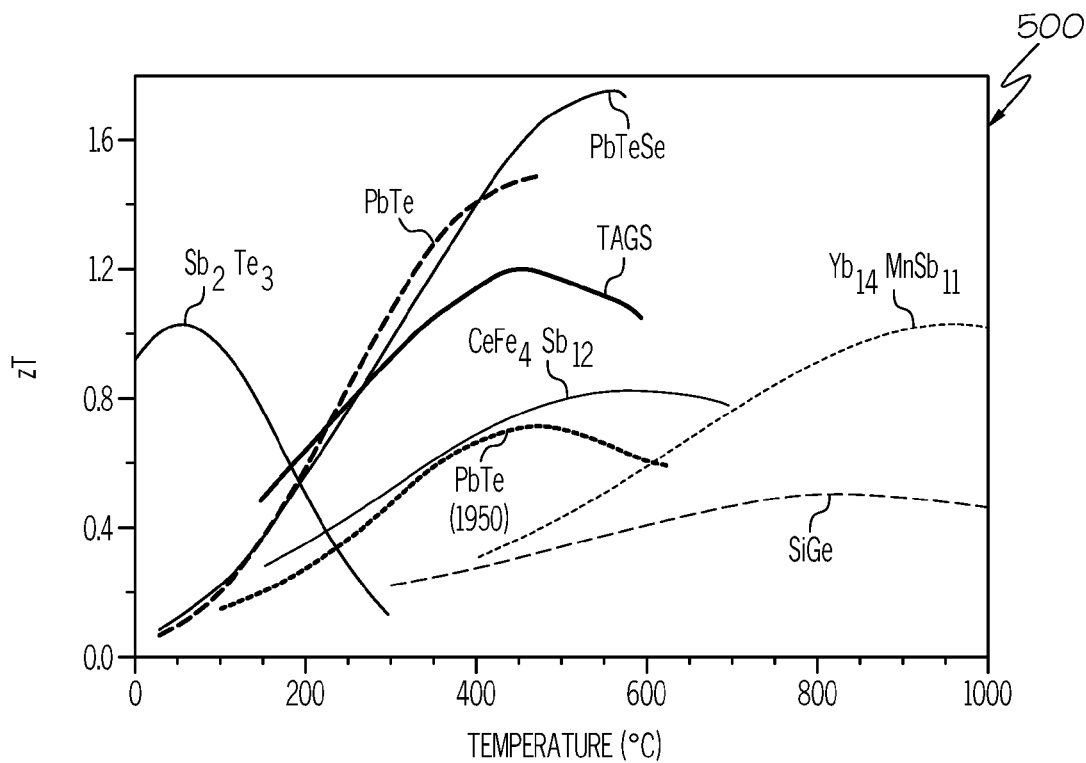
FIG. 5 is a graph illustrating an efficiency of different p-type thermoelectric generator materials at different temperatures in accordance with an embodiment of the present disclosure.

Referring also to FIG. 4 and FIG. 5, FIG. 4 is a graph 400 illustrating an efficiency of different n-type thermoelectric generator materials at different temperatures in accordance with an embodiment of the present disclosure. FIG. 5 is a graph 500 illustrating an efficiency of different p-type thermoelectric generator materials at different temperatures in accordance with an embodiment of the present disclosure. The graphs 400 and 500 show ZT for TEG devices composed of different materials over temperatures from 0 degrees C. to 1000 degrees C. ZT is a dimensionless figure of merit that corresponds to an ability of a given material or combination of materials to efficiently produce electric power. ZT may be defined by equation 2:

$$ZT = \frac{\sigma S^2 T}{\lambda} \quad \text{Equation 2}$$

Where S is the Seebeck coefficient, $\lambda$ is the thermal conductivity of the material or materials, $\sigma$ is the electrical conductivity and T is the temperature. The higher ZT for a particular TEG device composed of a certain material or materials at a particular temperature or temperature range, the more efficient the TEG device composed of those materials is at generating electrical power at the particular temperature or temperature range. Accordingly, thermoelectric generator assemblies 116 that include different type TEG device 124, 134 and 144 that have a higher ZT or a higher efficiency of generating electrical power may be used at certain locations along the along the nozzle 100 based on a temperature of the exterior surface 114 of the nozzle 100 during operation of the thruster 102.

In accordance with an embodiment, the plurality of thermoelectric generator assemblies 116 may be distributed along the exterior surface 114 of the nozzle 100 at predetermined locations between the intake 106 and the exhaust 108 to maximize electrical power generation. The plurality of thermoelectric generator assemblies 116 may include different types of TEG devices 124,134 and 144, each different type of TEG device 124, 134 and 144 may be formed from a particular material or particular group of materials configured to provide a highest efficiency of thermal energy to electrical energy conversion based on a temperature of the exterior surface 114 of the nozzle 100, during operation of the thruster 102, where each of the plurality of thermoelectric generator assemblies 116 is located between the intake 106 and the exhaust 108. Therefore, the different types of TEG devices 124, 134 and 144 may be configured to generate a predetermined level of electrical power based on a temperature of the exterior surface 114 of the nozzle 100 at the predetermined location of the TEG assembly 116 during operation of the thruster 102.

Figure 6:
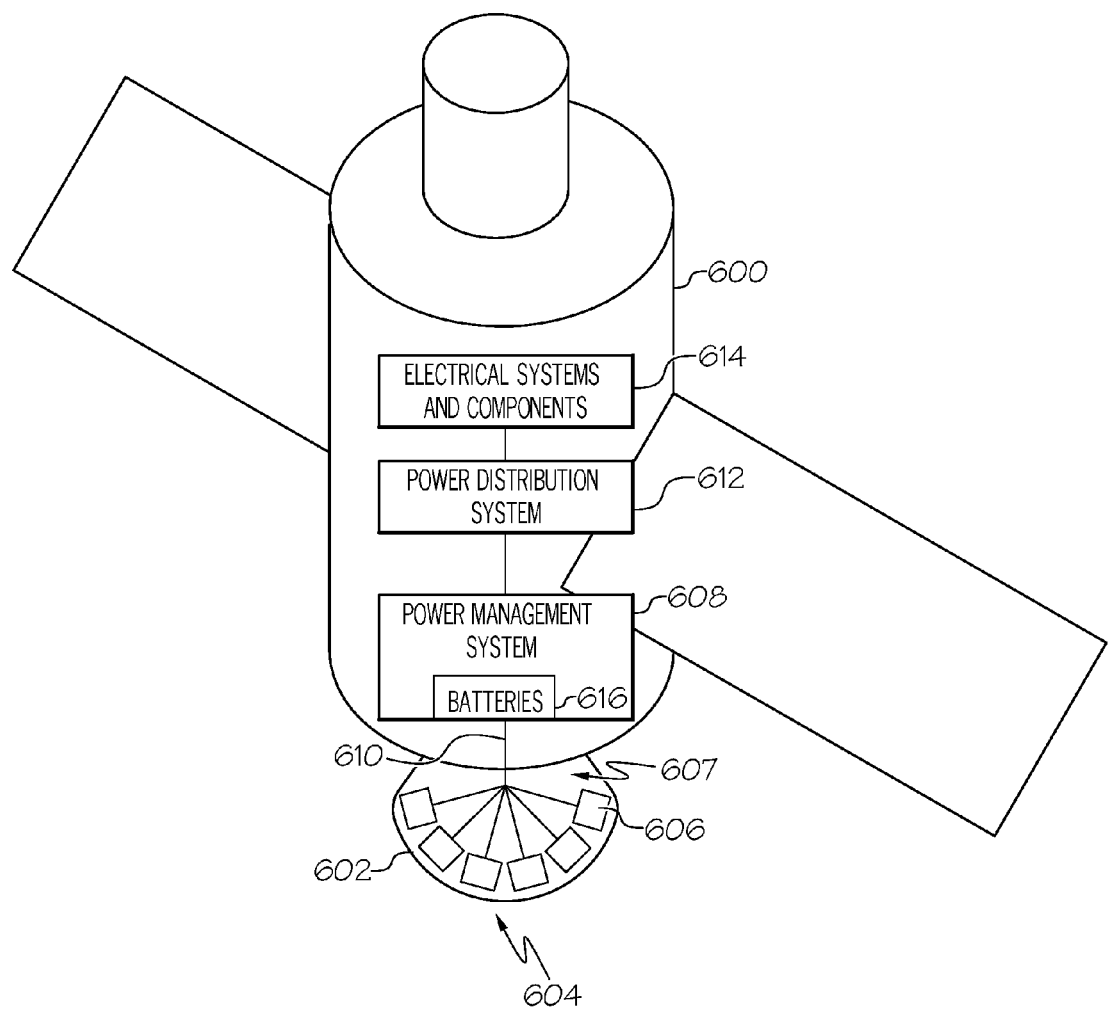
FIG. 6 is a schematic diagram of an example of a spacecraft including a thruster nozzle and a system for recapturing energy in accordance with an embodiment of the present disclosure.

FIG. 6 is a schematic diagram of an example of a spacecraft 600 including a thruster nozzle 602 and a system 604 for recapturing energy in accordance with an embodiment of the present disclosure. The system 604 for recapturing energy may be similar to the system 104 described with reference to FIGS. 1-3 The system 604 for recapturing energy may include a plurality of thermoelectric generator assemblies 606. The thermoelectric generator assemblies 606 may be similar to the thermoelectric generator assemblies 116 described herein. An electrical wiring system 607 may electrically connect the thermoelectric generator assemblies 606 to a power management system 608. The thermoelectric generator assemblies 606 may be electrically connected in series. The electrical wiring system 607 may include a power bus 610 that connects the thermoelectric generator assemblies 606 to the power management system 608. The power management system 608 may be operatively connected to a power distribution system 612 that distributes the electrical power to electrical systems and components 614 of the spacecraft 600. The power management system 608 may regulate and/or covert the electrical power for use by the electrical systems and components 614 of the spacecraft 600. The power management system 608 may include batteries 616 for powering the electrical systems or components 614 or the batteries may be a separate component. The power management system 608 may recharge the batteries.

Figure 7:
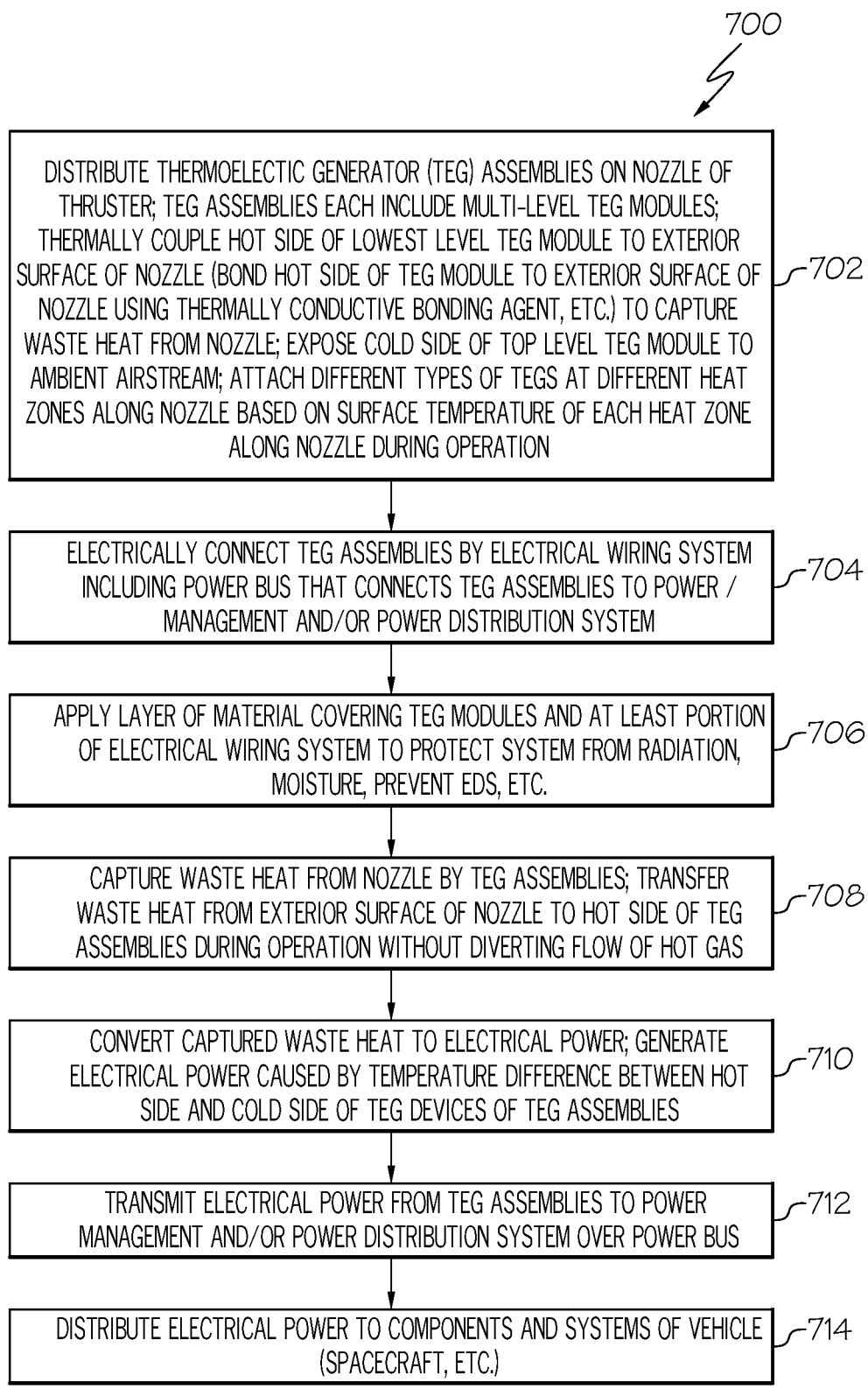
FIG. 7 is a flow chart of an example of a method for recapturing energy in accordance with an embodiment of the present disclosure.

FIG. 7 is a flow chart of an example of a method 700 for recapturing energy in accordance with an embodiment of the present disclosure. In block 702, a plurality of thermoelectric generator assemblies may be distributed along an exterior surface of a thruster nozzle. The thermoelectric generator assemblies may be similar to thermoelectric generator assemblies 116. The thermoelectric generator assemblies may each include multi-level TEG modules (TEMs). The TEMs may be similar to TEMs 118, 128 and 138 described herein. Each level of the TEMs may include a plurality of TEG devices. A hot side of a first level or lowest level TEM of each thermoelectric generator assembly may be thermally coupled to an exterior surface of the nozzle using a thermally conductive bonding agent, adhesive or similar material for thermally attaching the thermoelectric generator assemblies to the nozzle to capture waste heat from the nozzle. A cold side of a third level or top level TEM of each thermoelectric generator assembly may be exposed to ambient air or, in another embodiment, the cold side of the top level TEG module may be thermally coupled to a thermally conductive device. The thermally conductive device may be operatively connected to a thermal management system similar to thermal management system 148 described with reference to FIG. 2. Different types of TEG assemblies that include different types of TEG devices may be used at different locations or distributed among different heat zones along the nozzle based on a surface temperature along the nozzle to provide a highest efficiency of conversion of thermal energy to electrical energy during operation of the thruster. The different types of TEG assemblies may also each include different types of TEG devices in different levels or layers of TEG modules to provide a highest efficiency of conversion of thermal energy to electric energy in each level of TEG modules similar to that previously described.

In block 704, each of the TEG assemblies may be electrically connected by an electrical wiring system. The electrical wiring system may include a power bus for electrically connecting the TEG assemblies to a power management system and/or to a power distribution system. A power management system may be provided to convert and regulate electrical power generated by the TEG assemblies that is usable by systems and components of a vehicle or spacecraft associated with the thruster. The electrical power may be distributed to the systems and components of the vehicle by the power distribution system. TEG assemblies may be electrically connected in series with one another. The TEG modules within each TEG assembly may also be electrically connected in series.

In block 706, a layer of material may be applied covering the TEG assemblies and at least a portion of the electrical wiring system to protect the system from radiation and moisture. The layer of material may also include properties that prevent electrostatic discharge.

In block 708, waste heat may be captured from the nozzle by the TEG assemblies by transferring the waste heat from the exterior surface of the nozzle to a hot side of a first level or lowest level TEG module and then transferring heat through each level TEG module to a cold side of the highest level TEG module of each of the TEG assemblies during operation of the thruster to convert the waste heat to electrical power.

In block 710, waste heat captured from the nozzle by the TEG assemblies may be converted to electrical power by the TEG assemblies. Electrical power may be generated by a temperature differential between the hot side and a cold side of the TEG devices of each of the TEG assemblies as described herein.

In block 712, electrical power generated by the TEG assemblies may be transmitted to a power management system and/or power distribution system by a power bus. In block 714, electrical power may be distributed to the components and systems of a vehicle by the power distribution system.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of embodiments of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to embodiments of the invention in the form disclosed. Many modifications and variations will be apparent to those of ordinary skill in the art without departing from the scope and spirit of embodiments of the invention. The embodiment was chosen and described in order to best explain the principles of embodiments of the invention and the practical application, and to enable others of ordinary skill in the art to understand embodiments of the invention for various embodiments with various modifications as are suited to the particular use contemplated.

Although specific embodiments have been illustrated and described herein, those of ordinary skill in the art appreciate that any arrangement which is calculated to achieve the same purpose may be substituted for the specific embodiments shown and that embodiments of the invention have other applications in other environments. This application is intended to cover any adaptations or variations of the present invention. The following claims are in no way intended to limit the scope of embodiments of the invention to the specific embodiments described herein.

What is claimed is:

1. A system for recapturing energy, comprising:
a thermoelectric generator assembly configured for thermally attaching to a surface heated by one of plasma heating and ionization heating, the thermoelectric generator assembly comprising:
a first level thermoelectric generator module, the first level thermoelectric generator module comprising a hot side that is thermally attached to the surface, a cold side opposite to the hot side and a plurality of thermoelectric generator devices disposed between the hot side and the cold side, the plurality of thermoelectric generator devices generates an electric current based on a temperature differential across each of the plurality of thermoelectric generator devices;
a second level thermoelectric generator module stacked on the first level thermoelectric generator module, the second level thermoelectric generator module comprising a hot side thermally attached to the cold side of the first level thermoelectric generator module, a cold side opposite to the hot side and a plurality of thermoelectric generator devices disposed between the hot side and the cold side, the plurality of thermoelectric generator devices generates an electric current based on a temperature differential across each of the plurality of thermoelectric generator devices, wherein the hot side and the cold side of the first level thermoelectric generator module and the second level thermoelectric generator module are each a continuous sheet of material, and the first level thermoelectric generator module and the second level thermoelectric generator module are arranged in a stacked configuration using a pyramid geometry for increased temperature differential across each of the thermoelectric generator modules, an area of the hot side and the cold side of the second level thermoelectric generator module being smaller than an area of the hot side and cold side of the first level thermoelectric generator module and wherein the first level thermoelectric generator module and the second level thermoelectric generator module each comprise a radial radius of curvature and an axial radius of curvature to match a contour of the surface; and
an electrical wiring system comprising electrical conductors that electrically connect the second level thermoelectric generator module to the first level thermoelectric generator module in series, wherein the electrical wiring system supplies the electric current generated by the first level thermoelectric generator module and the second level thermoelectric generator module to an electrical power apparatus.

2. The system of claim 1, comprising a third level thermoelectric generator module stacked on the second level thermoelectric generator module, the third level thermoelectric generator module comprising a hot side thermally attached to the cold side of the second level thermoelectric generator module, a cold side opposite the hot side and a plurality of thermoelectric generator devices disposed between the hot side and the cold side, the plurality of thermoelectric generator devices generates an electric current based on a temperature differential across the plurality of thermoelectric generator devices, the third level thermoelectric generator module being electrically connected to the second level thermoelectric generator module by the electrical wiring system and the first level thermoelectric generator module, the second level thermoelectric generator module and the third level thermoelectric generator module are arranged in a triple stack configuration using the pyramid geometry for increased temperature differential across each of the thermoelectric generator modules, wherein an area of the hot side and the cold side of each of the thermoelectric generator modules decreases from the first level thermoelectric generator module to the third level thermoelectric generator module.

3. The system of claim 2, wherein the first level thermoelectric generator module, the second level thermoelectric generator module and the third level thermoelectric generator module are electrically connected in series.

4. The system of claim 2, wherein each of the first level, second level and third level thermoelectric generator modules comprise a different type of thermoelectric generator device, the different type of thermoelectric generator device of each of the first level, second level and third level thermoelectric generator modules is configured to generate a predetermined level of electrical power based on a temperature on the hot side of each respective thermoelectric generator module and a temperature differential between the hot side and the cold side of each respective thermoelectric generator module.

5. The system of claim 2, wherein each of the first level, second level and third level thermoelectric generator modules comprise a different type of thermoelectric generator device based on an efficiency in converting thermal energy to electrical energy accordingly to a temperature on the hot side of each respective thermoelectric generator module and a temperature differential between the hot side and the cold side of each respective thermoelectric generator module.

6. The system of claim 2, further comprising a thermally conductive device thermally attached to the cold side of the third level thermoelectric generator module, the thermally conductive device being configured for connecting to a thermal management system.

7. The system of claim 2, further comprising a layer of material covering the thermoelectric generator modules and at least a portion of the electrical wiring system, the layer of material being configured to protect the system from radiation and moisture and to prevent electrostatic discharge from the system.

8. The system of claim 1, wherein the first level thermoelectric generator module and the second level thermoelectric generator module comprise flexible materials that allow the first level and second level thermoelectric generator modules to flex with any movement of the surface.

9. The system of claim 1, wherein the second level thermoelectric generator module is thermally attached to the first level thermoelectric generator module and the first level thermoelectric generator module is thermally attached to the surface by a thermally conductive bonding agent that comprises properties to prevent electrostatic discharge.

10. The system of claim 1, wherein the surface is an exterior surface of a nozzle of a thruster, wherein the thruster comprises one of an electromagnetic thruster, an electrostatic thruster and an electrothermal thruster and the nozzle comprises an intake and an exhaust.

11. The system of claim 10, further comprising a plurality of thermoelectric generator assemblies distributed about the exterior surface of the nozzle, wherein the thermoelectric generator assemblies comprise different types of thermoelectric generator devices used in different heat zones along an axis of the nozzle to provide efficient conversion of thermal energy to electrical energy.

12. A system for recapturing energy, comprising:
a thruster comprising a nozzle, wherein the nozzle is heated by plasma heating or ionization heating of propellant gases being discharged through the nozzle;

a plurality of thermoelectric generator assemblies, each thermoelectric generator assembly comprising:
  a first level thermoelectric generator module, the first level thermoelectric generator module comprising a hot side thermally attached to an exterior surface of the nozzle, a cold side opposite to the hot side and a plurality of thermoelectric generator devices disposed between the hot side and the cold side, the plurality of thermoelectric generator devices generates an electric current based on a temperature differential across each of the plurality of thermoelectric generator devices;
  a second level thermoelectric generator module stacked on the first level thermoelectric generator module, the second level thermoelectric generator module comprising a hot side thermally attached to the cold side of the first level thermoelectric generator module, a cold side opposite to the hot side and a plurality of thermoelectric generator devices disposed between the hot side and the cold side, the plurality of thermoelectric generator devices generates an electric current based on a temperature differential across each of the plurality of thermoelectric generator devices, wherein the hot side and the cold side of the first level thermoelectric generator module and the second level thermoelectric generator module are each a continuous sheet of material, and the first level thermoelectric generator module and the second level thermoelectric generator module are arranged in a stacked configuration using a pyramid geometry for increased temperature differential across each of the thermoelectric generator modules, an area of the hot side and the cold side of the second level thermoelectric generator module being smaller than an area of the hot side and cold side of the first level thermoelectric generator module, and wherein the first level thermoelectric generator module and the second level thermoelectric generator module each comprise a radial radius of curvature and an axial radius of curvature to match a contour of the nozzle; and
  an electrical wiring system comprising electrical conductors that electrically connect the second level thermoelectric generator module to the first level thermoelectric generator module in series, wherein the electrical wiring system supplies the electrical current generated by the first level thermoelectric generator module and the second level thermoelectric generator module to a power management system.

13. The system of claim 12, comprising a third level thermoelectric generator module stacked on the second level thermoelectric generator module, the third level thermoelectric generator module comprising a hot side thermally attached to the cold side of the second level thermoelectric generator module, a cold side opposite the hot side and a plurality of thermoelectric generator devices disposed between the hot side and the cold side, the plurality of thermoelectric generator devices generates an electric current based on a temperature differential across the plurality of thermoelectric generator devices, the third level thermoelectric generator module being electrically connected to the second level thermoelectric generator module by the electrical wiring system and the first level thermoelectric generator module, the second level thermoelectric generator module and the third level thermoelectric generator module are arranged in a triple stack configuration using the pyramid geometry for increased temperature differential across each of the thermoelectric generator modules, wherein the area of the hot side and the cold side of each of the thermoelectric generator modules decreases from the first level thermoelectric generator module to the third level thermoelectric generator module.

14. The system of claim 13, wherein each of the first level, second level and third level thermoelectric generator modules comprise a different type of thermoelectric generator device based on a efficiency in converting thermal energy to electrical energy accordingly to a temperature on the hot side of each respective thermoelectric generator module and a temperature differential between the hot side and the cold side of each respective thermoelectric generator module.

15. The system of claim 1, wherein each of the thermoelectric generator devices of the first level thermoelectric generator module and the second level thermoelectric generator module comprise one or more p-doped semiconductors and one or more n-doped semiconductors.

16. The system of claim 13, wherein each of the first level, second level and third level thermoelectric generator modules comprise a different type of thermoelectric generator device, the different type of thermoelectric generator device of each of the first level, second level and third level thermoelectric generator modules is configured to generate a predetermined level of electrical power based on a temperature on the hot side of each respective thermoelectric generator module and a temperature differential between the hot side and the cold side of each respective thermoelectric generator module.

17. The system of claim 12, wherein the plurality of thermoelectric generator assemblies are distributed about the exterior surface of the nozzle, and wherein the thermoelectric generator assemblies comprise different types of thermoelectric generator devices used in different heat zones along an axis of the nozzle to provide efficient conversion of thermal energy to electrical energy.

18. The system of claim 12, wherein the second level thermoelectric generator module is thermally attached to the first level thermoelectric module and the first level thermoelectric generator module is thermally attached to the surface by a thermally conductive bonding agent that comprises properties to prevent electrostatic discharge.

19. The system of claim 12, further comprising a layer of material covering the thermoelectric generator modules and at least a portion of the electrical wiring system, the layer of material being configured to protect the system from radiation and moisture and to prevent electrostatic discharge from the system.

20. The system of claim 12, wherein the first level thermoelectric generator module and the second level thermoelectric generator module comprise flexible materials that allow the first level and second level thermoelectric generator modules to flex with any movement of the surface.

* * * * *